(12) United States Patent
Biber et al.

(10) Patent No.: US 8,526,902 B2
(45) Date of Patent: Sep. 3, 2013

(54) ARRANGEMENT FOR PROCESSING A NON-SYMMETRICAL AND A SYMMETRICAL SIGNAL

(75) Inventors: Stephan Biber, Erlangen/Frauenaurach (DE); Ralph Oppelt, Uttenreuth (DE); Robert Rehner, Neunkirchen am Brand (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 13/416,769

(22) Filed: Mar. 9, 2012

(65) Prior Publication Data

US 2013/0063221 A1    Mar. 14, 2013

(30) Foreign Application Priority Data

Mar. 10, 2011    (DE) .......................... 10 2011 005 349

(51) Int. Cl.
*H04B 7/00*    (2006.01)

(52) U.S. Cl.
USPC ............................ 455/285; 455/302; 348/571

(58) Field of Classification Search
USPC .......................... 455/285, 302; 348/607, 571
See application file for complete search history.

(56) References Cited

U.S. PATENT DOCUMENTS

| | | | | |
|---|---|---|---|---|
| 4,914,408 | A | * | 4/1990 | Voorman ...................... 333/167 |
| 6,987,542 | B2 | * | 1/2006 | Nieuwenhuizen ............ 348/607 |
| 7,505,332 | B1 | * | 3/2009 | Talbot ...................... 365/189.09 |
| 8,385,016 | B1 | * | 2/2013 | Tang .............................. 360/67 |

FOREIGN PATENT DOCUMENTS

| | | |
|---|---|---|
| DE | 914 636 C | 7/1954 |
| DE | 101 04 260 C2 | 5/2003 |

OTHER PUBLICATIONS

German Office Action dated Oct. 5, 2011 for corresponding German Patent Application No. DE 10 2011 005 349.2 with English translation.

* cited by examiner

*Primary Examiner* — Sonny Trinh
(74) *Attorney, Agent, or Firm* — Lempia Summerfield Katz LLC (57) ABSTRACT

An arrangement for processing a non-symmetrical signal includes an apparatus configured to balance and filter an image frequency of a nominal frequency of the non-symmetrical receiving signal. The apparatus includes a modified Boucherot bridge having a series or parallel oscillating circuit that replaces inductive or capacitive components of a conventional Boucherot bridge, such that the modified Boucherot bridge is in the harmonized state with the image frequency to be faded out and has a predetermined impedance with the nominal frequency on its symmetrical output terminals. The nominal frequency has a predetermined impedance on its symmetrical output terminals. The nominal frequency is transmitted as a signal balanced to ground to the symmetrical output terminals of the modified Boucherot bridge.

22 Claims, 6 Drawing Sheets

ARRANGEMENT FOR PROCESSING A NON-SYMMETRICAL AND A SYMMETRICAL SIGNAL

This application claims the benefit of DE 10 2011 005 349.2, filed Mar. 10, 2011.

BACKGROUND

The present embodiments relate to an arrangement for processing a non-symmetrical signal. The arrangement includes an apparatus for balancing and filtering an image frequency of a nominal frequency of the non-symmetrical receiving signal. The present embodiments further relate to an arrangement for processing a signal balanced to ground.

The apparatus for balancing transforms a real impedance balanced to ground into a real impedance balanced to ground for a specific nominal frequency and/or a defined frequency range about the nominal frequency. The problem of balancing and suppressing a higher frequency in the vicinity of the nominal frequency or a lower frequency (i.e., a so-called image frequency) in the vicinity of the nominal frequency usually occurs with receivers having a mixer that multiplies a receiving frequency with the frequency of a local oscillator. The image frequency is unwanted with respect to any further processing and should, therefore, be suppressed.

On account of the principle of reciprocity, this problem also applies in the reverse direction, when, for example, mixing a non-symmetrical signal during transmission.

Two different functional blocks were previously used to balance and suppress an image frequency. The balancing was effected by a balancing unit such as a Boucherot bridge. A filter is used to fade-out the unwanted frequency. Using two separate functional blocks, however, results in a high outlay in components, such that the receiver needs a larger installation space.

Balancing and filtering may also be combined using so-called SAW (surface acoustic wave) filters (also known as surface wave filters). Such filters are, however, very expensive for custom-made products, particularly for products, such as medical devices, with a small number of pieces. Magnetically coupled dual circuit band filters may also combine both functions, but for image frequencies in the vicinity of the receiving frequency, high quality coils, i.e., coils with a large design, are used and the degree of magnetic coupling must be precisely known, both of which are disadvantageous in practice.

SUMMARY AND DESCRIPTION

The present embodiments may obviate one or more of the drawbacks or limitations in the related art. For example, an arrangement that processes a non-symmetrical and/or symmetrical signal in a simpler manner may be provided.

The present embodiments relate to an arrangement for processing a non-symmetrical signal. The arrangement includes an apparatus for balancing and filtering an image frequency of a nominal frequency of the non-symmetrical signal. The apparatus for combined balancing and filtering includes a modified Boucherot bridge, in which the inductive or capacitive components may be replaced by a series or parallel oscillating circuit, such that the modified Boucherot bridge is in a harmonized state with the image frequency to be faded out and exhibits a predetermined impedance at its symmetrical output terminals at the nominal frequency. The nominal frequency $f_0$ is transmitted as a signal balanced to ground to the symmetrical output terminals Out1, Out2 of the modified Boucherot bridge BF. Accordingly, the image frequency of the signal is provided in-phase and with the same amplitude on the two symmetrical output terminals, with respect to ground. Although the nominal frequency is provided with the same amplitude on the two output terminals, it is provided out of phase on the two output terminals. The voltage difference between the two output terminals is, therefore, zero with the image frequency, but the voltage difference with the nominal frequency is twice as large as the voltage of an output with respect to ground. The modified Boucherot bridge, just like the unmodified or conventional version, is also configured to transform a predetermined real impedance with the nominal frequency from its non-symmetrical input to another generally real impedance at its symmetrical output.

In one embodiment, the non-symmetrical signal is a receiving signal. On account of the reciprocity of two passive ports, the present embodiments may be used, for example, in a transmission application where the signal runs through the network in a reverse direction. The present embodiments therefore provide an arrangement for processing a signal balanced to ground. The arrangement includes an apparatus configured to convert a signal balanced to ground into a signal unbalanced to ground with a nominal frequency (unbalancing) and balance and filter an image frequency of a nominal frequency of the signal balanced to ground. The apparatus configured to perform combined de-balancing and filtering includes a modified Boucherot bridge, in which the inductive or capacitive components of a conventional Boucherot bridge may be replaced by a series or parallel oscillating circuit, such that the modified Boucherot bridge is in a harmonized state with the image frequency to be faded out and has a predetermined impedance on its non-symmetrical output terminal with the nominal frequency. The nominal frequency is transmitted as a non-symmetrical signal to the non-symmetrical output terminal of the modified Boucherot bridge.

By providing a modified Boucherot bridge, the originally two separate functional blocks may be combined into a single functional block. It is thus possible, for example, to dispense with using a separate filter to suppress one of the image frequencies and instead use the modified Boucherot bridge, as a result of which the outlay of components and space requirements is lower. By omitting the separate filter, a reduction in unwanted filter admission attenuation is also enabled.

In one embodiment, the modified Boucherot bridge includes a first and a second signal path. The first signal path includes a series circuit between a terminal of a first port and a reference potential terminal. The series circuit includes an inductive component and a capacitive component. The node point between the two components forms a first terminal of a second port. The second signal path includes a series circuit that has a capacitive component and an inductive component between the terminal of the first port and the reference potential terminal. The node point between the two components forms a second terminal of the second port. The inductive components of the first and second path have the same inductance value. The capacitive components of the first and second path have the same capacitance value. With the image frequency, the series or parallel oscillating circuit of the first and second path of the modified Boucherot bridge, which replaces the inductive or capacitive component of the conventional Boucherot bridge in each path, has the same impedance as the still unmodified component such that the modified Boucherot bridge is in the harmonized state.

To suppress an unwanted suppression of an image frequency that is larger than the nominal frequency, the inductive components of the first and second path may be formed by a parallel circuit having an inductance and a capacitance or the capacitive components of the first path and the second path may be formed by a series circuit having an inductance and a capacitance.

To suppress an unwanted image frequency that is smaller than the nominal frequency, the inductive components of the first and second path may be formed by a series circuit having an inductance and a capacitance or the capacitive components of the first path and of the second path may be formed by a parallel circuit having an inductance and a capacitance.

In one embodiment, the inductances are realized as coils without a core so that the arrangement may also be used in strong magnetic fields.

In another embodiment, a (loss) resistor is connected in parallel with the capacitive component of the first and second path. The capacitive component is not replaced by a series or parallel oscillating circuit in this embodiment. The value of the loss resistor corresponds to the inductance losses in the respective path. Alternatively, a (loss) resistor may be connected in series with the capacitive component of the first and second path. The capacitive component is not replaced by a series or parallel oscillating circuit in this embodiment. The value of the loss resistor corresponds to the inductance losses in the respective path. Accordingly, the real losses in the coils may be reproduced on the capacitive component. Although this causes an increase in the transmission losses, the blocking attenuation for the image band to be suppressed is greatly strengthened.

The present embodiments also relate to an antenna facility having an arrangement as described above.

DETAILED DESCRIPTION OF THE DRAWINGS

The embodiments described herein are described in connection with the receipt of a non-symmetrical (receiving) signal. One having ordinary skill in the art will realize that the embodiments described herein may also be used in connection with the transmission of a signal balanced to ground.

Figure 1:
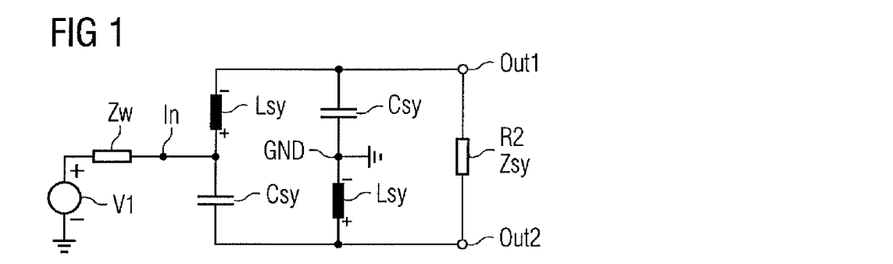
FIG. 1 shows a known Boucherot bridge.

FIG. 1 shows a Boucherot bridge that is generally known in the art. This bridge includes a first signal path between an input $I_n$ of an input port and a reference potential terminal GND from a series circuit that includes an inductive component Lsy and a capacitive component Csy. The node point between the two components Lsy and Csy forms a first output Out1 of an output port. A second signal path is formed between the input $I_n$ and the reference potential terminal GND from a series circuit that includes a capacitive component Csy and an inductive component Lsy. The node point between the two components Csy and Lsy forms a second output Out2 of the output port. The two identical capacitive components have a reactance with a specific nominal frequency that corresponds in magnitude to the reactance of the two identical inductive components. The specific frequency of the two capacitive components, however, has a different leading sign (i.e., positive or negative) than the reactance of the inductive components. The input $I_n$ is connected to a voltage source $V_1$.

The real characteristic impedance at the input $I_n$, which is characterized by $Z_w$, may be transformed into any arbitrary real characteristic impedance Zsy at the symmetrical outputs Out1, Out2. The Boucherot bridge, therefore, represents two λ/4 lines that are connected in parallel at input $I_n$, whereby a signal in the phase is rotated back by 90° in the second path (C-L-C structure) and the signal is preturned by 90° in the first path (L-C-L structure). The LC parallel circuit produced at input $I_n$ is not shown since this represents an open circuit at the nominal frequency. It is, therefore, also possible to physically dispense with the LC parallel circuit.

The subsequent example illustrates how the components of the known Boucherot bridge are calculated to balance a non-symmetrical receiving signal. The nominal frequency $f_0$, also referred to as mid-band frequency, should amount to 63.6 MHz. The characteristic impedance Zw at the non-symmetrical input amounts to, for example, 50Ω, which is to be transformed into a characteristic impedance Zsy of 200Ω at the output. The angular frequency may be determined from the mid-band frequency $f_0$:

$$\omega o := 2 \cdot \pi \cdot fo \quad (1)$$

The dimensionless auxiliary quantity results from the impedance ratio:

$$\varsigma := \frac{Zsy}{Zw} = 4, \quad (2)$$

Lsy and Csy may be determined with equation (1) and the fact that discrete lines which lead or lag by 90° are to be simulated:

$$Lsy := \frac{Zw\sqrt{\varsigma}}{\omega o} = 2.502 \times 10^{-7} H \quad (3)$$

$$Csy := \frac{1}{\omega o^2 \cdot Lsy} = 2.502 \times 10^{-11} F. \quad (4)$$

Figure 2:
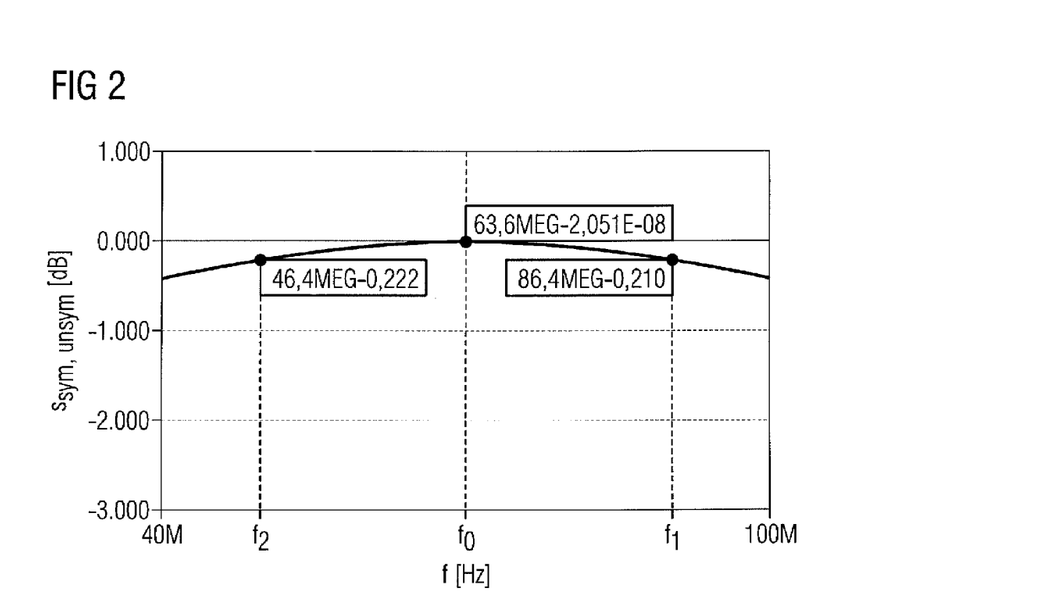
FIG. 2 shows the frequency response of the known Boucherot bridge for balancing a non-symmetrical receiving signal.

The Boucherot bridge shown in FIG. 1 is not, however, suited to suppressing frequencies in the vicinity of the nominal frequency $f_0$. This is apparent from the frequency response, shown in FIG. 2, of the known Boucherot bridge. The transmission $s_{sym,unsym}$ in dB is shown in FIG. 2 as a function of frequency f. If the frequencies $f_1$=46.4 MHz and $f_2$=86.4 MHz are, for instance, unwanted, then these frequencies were attenuated by only approximately 0.2 dB. The frequencies $f_1$ and $f_2$ represent so-called image frequencies.

Figure 3:
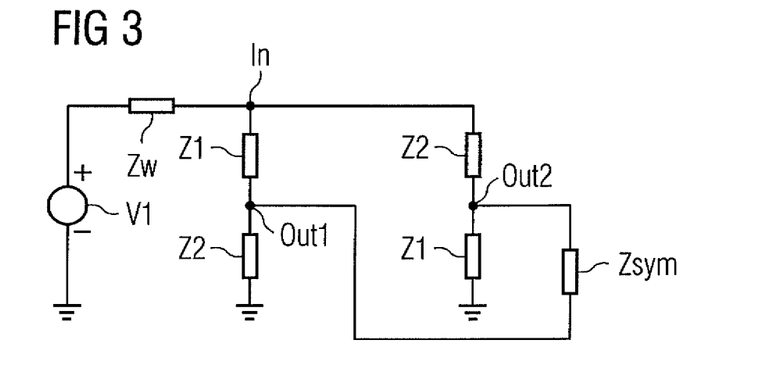
FIG. 3 shows a generalized version of the Boucherot bridge of FIG. 1.

FIG. 3 shows a more generalized version of the Boucherot bridge of FIG. 1. Impedances Z1 are shown as place holders for the inductive components Lsy. Impedances Z2 are shown as place holders for the capacitive components Csy. In order to suppress a specific frequency $f_1$ or $f_2$, or, in other words, filter using the Boucherot bridge, the Boucherot bridge is in the harmonized state for the frequency to be suppressed. In other words, the following expression applies:

$$Z_1(\omega_{1,2})=Z_2(\omega_{1,2}). \quad (5)$$

For the nominal frequency $f_0$, the components of the place holder of the modified Boucherot bridge are, on the other hand, such that the impedances Z1 and X2 have the original values calculated in the equations (3) and (4).

The modification of the Boucherot bridge depends here on whether the frequency to be suppressed, which is referred to as image frequency, is larger or smaller than the nominal frequency $f_0$. Based on this, a Boucherot bridge may be modified with minimal inductance or may be modified with minimal capacitance. A Boucherot bridge modified with a minimal inductance includes the lowest possible number of coils, while a Boucherot bridge modified with a minimal capacitance includes the lowest possible number of capacitances. The Boucherot bridge modified with a minimal inductance may be preferred because coils are afflicted with greater losses than capacitors.

Figure 4:
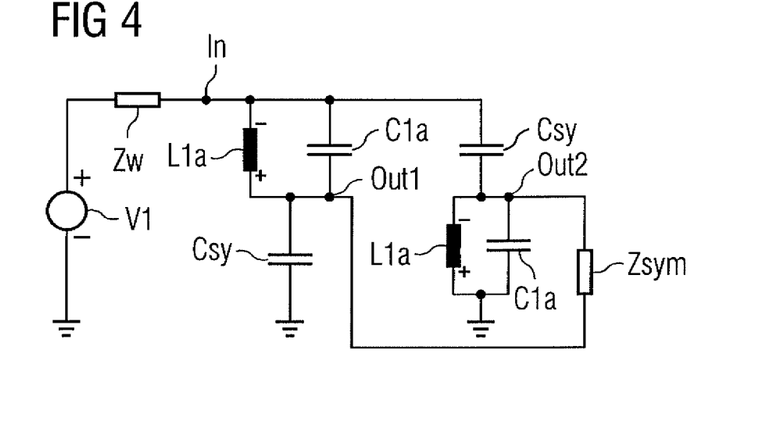
FIG. 4 shows one embodiment of an arrangement having a Boucherot bridge modified with minimal inductance for suppressing an image frequency that is larger than a nominal frequency.

FIG. 4 shows one embodiment of an arrangement having a Boucherot bridge modified with minimal inductance for suppressing an image frequency $f_1$ that is greater than the nominal frequency $f_0$. According to this embodiment, the inductive components of the first and second path, i.e. the place holder Z1 shown in FIG. 3, are formed by a parallel circuit having an inductance L1$a$ and capacitance C1$a$. To ensure that the arrangement shown in FIG. 4 fulfills the condition specified in equation (5), the inductance L1$a$ and the capacitance C1$a$ are dimensioned as follows:

The admittance $Y_{a1}$ (=reciprocal impedance) of the oscillating circuit $L_{1a}$ and $C_{1a}$ is given by:

$$Y_{1a}(\omega) = \frac{1 - \omega^2 L_{1a} C_{1a}}{j\omega L_{1a}} \quad (6)$$

With the signal frequency $\omega_0$, the admittance $Y_{1a}$ corresponds to the admittance of the coil $L_{sy}$:

$$\frac{1-\omega_0^2 L_{1a}C_{1a}}{j\omega_0 L_{1a}} := \frac{1}{j\omega_0 L_{sy}} \Rightarrow C_{1a} = \frac{1}{\omega_0^2 L_{1a}}\left(1-\frac{L_{1a}}{L_{sy}}\right) = \frac{1}{\omega_0^2}\left(\frac{1}{L_{1a}}-\frac{1}{L_{sy}}\right) \quad (7)$$

With the blocking frequency $\omega_1$, $Y_{1a}$ corresponds to the admittance of the capacitor $C_{sy}$:

$$\frac{1-\omega_1^2 L_{1a}C_{1a}}{j\omega_1 L_{1a}} := j\omega_1 C_{sy} \quad (8)$$

If the right-hand side of equation (7) is substituted for $C_{1a}$ in equation (8), $L_{1a}$ is left as the only unknown:

$$\frac{1-\frac{\omega_1^2}{\omega_0^2}\left(1-\frac{L_{1a}}{L_{sy}}\right)}{j\omega_1 L_{1a}} := j\omega_1 C_{sy} \quad (9)$$

Solving for $L_{1a}$ in equation (9), the following expression, for the inductance, results:

$$L_{1a} = L_{sy} \frac{1-\left(\frac{\omega_0}{\omega_1}\right)^2}{1+\omega_0^2 L_{sy} C_{sy}} \quad (10)$$

The right-hand side of equation (10) is substituted for $L_{1a}$ in equation (7), and after solving for $C_{1a}$, the following expression, for the capacitor, results:

$$C_{1a} = \frac{1}{\omega_1^2 - \omega_0^2}\left(\frac{1}{L_{sy}} + \omega_1^2 C_{sy}\right) \quad (11)$$

Since $f_1>f_0$ was assumed, both elements $L_{1a}$ and $C_{1a}$ were always positive (i.e., physically realizable). For the numerical values $Z_w$=50Ω, $Z_{sym}$=200Ω, $f_0$=63.6 MHz and $f_1$=86.4 MHz, which are used in connection with FIG. 1, values of $C_{1a}$=84.2 pF and $L_{1a}$=57.3 nH are obtained here.

Figure 5:
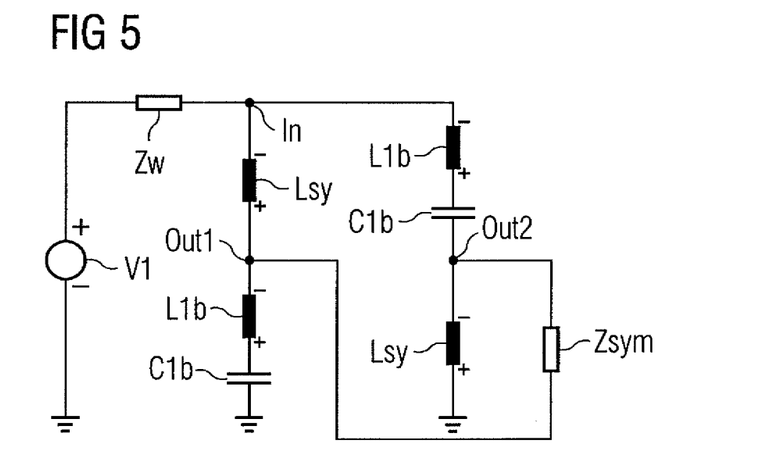
FIG. 5 shows another embodiment of an arrangement having a Boucherot bridge modified with minimal capacitance for suppressing an image frequency that is larger than the nominal frequency.

FIG. 5 shows another embodiment of the arrangement having a Boucherot bridge modified with minimal capacitance for suppressing an image frequency $f_1$ that is larger than the nominal frequency $f_0$. In this embodiment, the capacitive components of the first path and of the second path, i.e. the space holders Z2 shown in FIG. 3, are formed by a series circuit having an inductance L1$b$ and a capacitance C1$b$. Expressions for determining the capacitance C1$b$ and the inductance L1$b$ from the known components Csy and Lsy may be derived using the same methodology employed in connection with FIG. 4. Accordingly, the following expressions are produced:

$$C_{1b} = C_{sy} \frac{1-\left(\frac{\omega_0}{\omega_1}\right)^2}{1+\omega_0^2 L_{sy} C_{sy}}, \text{ and} \quad (12)$$

$$L_{1b} = \frac{1}{\omega_1^2 - \omega_0^2}\left(\frac{1}{C_{sy}} + \omega_1^2 L_{sy}\right) \quad (13)$$

For the numerical values $Z_w$=50Ω, $Z_{sym}$=200Ω, $f_0$=63.6 MHz and $f_1$=86.4 MHz, used in connection with FIG. 1, $C_{1b}$=5.73 pF and $L_{1b}$=842 nH are obtained here.

Figure 6:
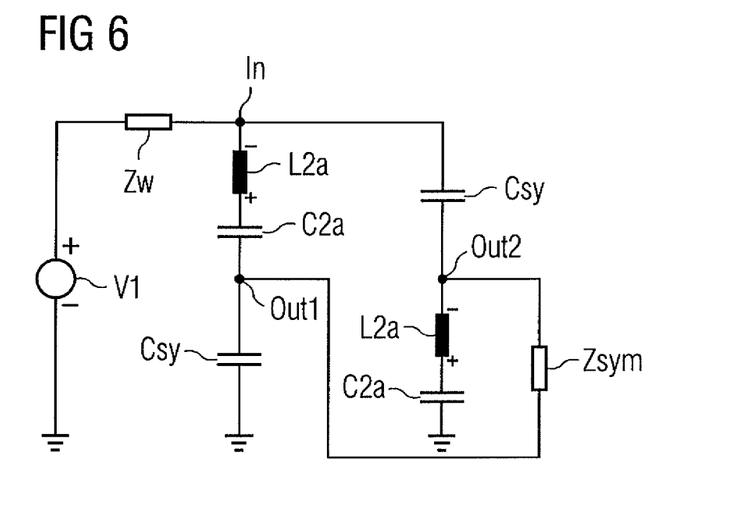
FIG. 6 shows another embodiment of an arrangement having a Boucherot bridge modified with minimal inductance for suppressing an image frequency that is smaller than the nominal frequency.

FIG. 6 shows another embodiment of the arrangement with a Boucherot bridge modified with minimal inductance for fading out an image frequency $f_2$ that is less than the nominal frequency $f_0$. In this embodiment, the inductive components of the first and second path (cf. the place holder Z1 for the impedances, shown in FIG. 3) are formed by a series circuit having an inductance L2$a$ and a capacitance C2$a$. Expressions for determining the capacitance C2$a$ and the inductance L2$a$ from the known components Csy and Lsy may be derived using the same methodology employed in connection with FIG. 4. Accordingly, the following expressions are produced:

$$C_{2a} = C_{sy} \frac{1 - \left(\frac{\omega_2}{\omega_0}\right)^2}{1 + \omega_2^2 L_{sy} C_{sy}}, \text{ and} \tag{14}$$

$$L_{2a} = \frac{1}{\omega_0^2 - \omega_2^2}\left(\frac{1}{C_{sy}} + \omega_0^2 L_{sy}\right) \tag{15}$$

The values for $C_{2a}$ and $L_{2a}$ are also always positive here, since $f_2 < f_0$ was presupposed. For the values $Z_w = 50\Omega$, $Z_{sym} = 200\Omega$, $f_0 = 63.6$ MHz and $f_2 = 46.4$, which are referred to in the introductory paragraphs, values of $C_{2a} = 7.64$ pF and $L_{2a} = 1070$ nH are obtained here.

Figure 7:
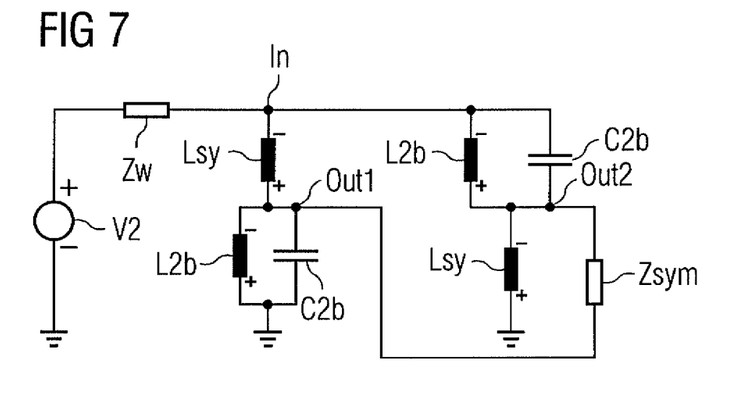
FIG. 7 shows another embodiment of an arrangement having a Boucherot bridge modified with minimal capacitance for suppressing an image frequency that is smaller than the nominal frequency.

FIG. 7 shows another embodiment of an arrangement in which a Boucherot bridge modified with minimal capacitance is shown in order to suppress an image frequency $f_2$ that is smaller than the nominal frequency $f_0$. In this embodiment, the capacitive components of the first and second path (cf. the impedances Z2 in FIG. 3) are formed by a parallel circuit having an inductance L2$b$ and a capacitance C2$b$. Expressions for determining the capacitance C2$b$ and the inductance L2$b$ from the known elements Csy and Lsy may be derived using the same methodology employed in connection with FIG. 4. Accordingly, the following expressions are produced:

$$C_{2b} = \frac{1}{\omega_0^2 - \omega_2^2}\left(\frac{1}{L_{sy}} + \omega_0^2 C_{sy}\right), \text{ and} \tag{16}$$

$$L_{2b} = L_{sy} \frac{1 - \left(\frac{\omega_2}{\omega_0}\right)^2}{1 + \omega_2^2 L_{sy} C_{sy}} \tag{17}$$

For the numerical values $Z_w = 50\Omega$, $Z_{sym} = 200\Omega$, $f_0 = 63.6$ MHz and $f_2 = 46.4$ MHz, which are referred to above, values of $C_{2b} = 107$ pF, and $L_{2b} = 76.4$ nH are obtained.

Figure 8:
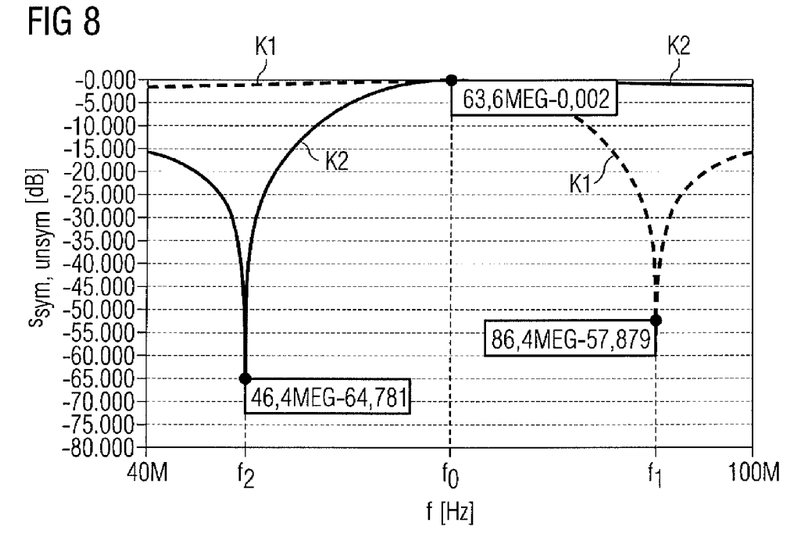
FIG. 8 shows the frequency response of the modified Boucherot bridges of FIGS. 4 and 6 with ideal components.

FIG. 8 shows the frequency response of the Boucherot bridges modified with minimal inductance according to the embodiments described in connection with FIGS. 4 and 6 with ideal components. In FIG. 8, K1 represents the frequency response when the image frequency f1=86.4 MHz is suppressed. K2, meanwhile, represents the frequency response when the image frequency f2=46.4 MHz is suppressed. It is apparent from FIG. 8 that an attenuation-free transmission of the nominal frequency $f_0$=63.6 MHz is given. Within the scope of the numerical resolution, a complete suppression (greater than 55 dB) of the image frequencies $f_1$ and $f_2$ takes place. Similar results are obtained using any of the arrangements with minimal capacitance described herein.

Figure 9:
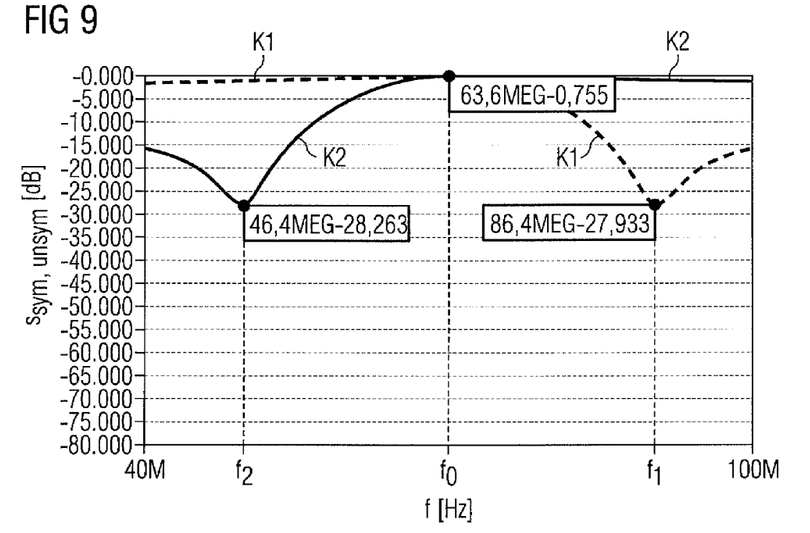
FIG. 9 shows the frequency response of the modified Boucherot bridges of FIGS. 4 and 6 with a finite coil quality of the inductances.

In reality, however, the coils of the modified Boucherot bridges have a finite quality. Air-core coils without a core are preferably used in the modified Boucherot bridge so that the arrangement is also possible in a magnetic field in, for instance, magnetic resonance devices. Air coils are, however, generally still more lossy than coils with a ferrite core. A finite transmission attenuation at the nominal frequency $f_0$ results herefrom. An incomplete suppression of the image frequencies $f_1$ and $f_2$ thus results, as shown by way of example in FIG. 9, since the bridge is no longer precisely harmonized because of the loss resistance. A coil quality of Q=30 forms the basis in FIG. 9. It is apparent from FIG. 9 that the image frequencies are only suppressed with approximately 28 dB.

Figure 10:
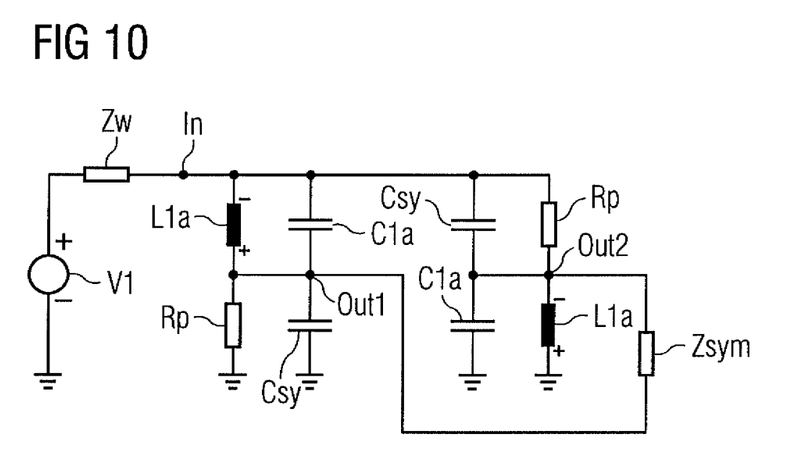
FIG. 10 shows another embodiment of a Boucherot bridge modified with minimal inductance and in which the coil losses are artificially reproduced in order to increase the blocking attenuation.
Figure 11:
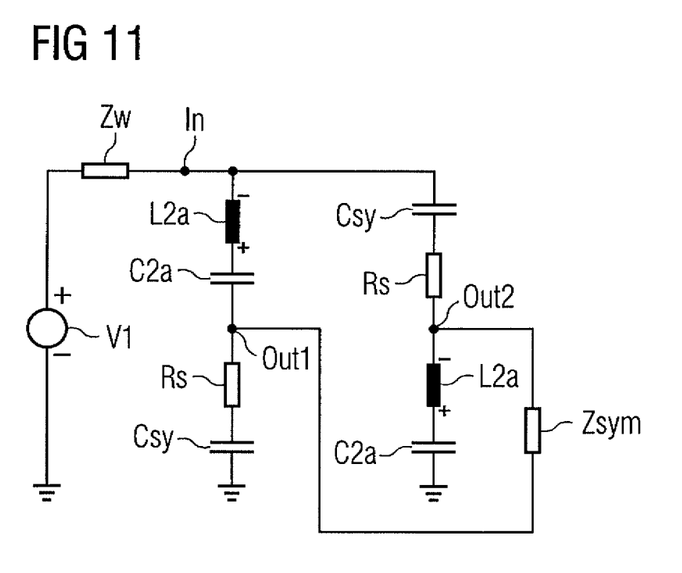
FIG. 11 shows another embodiment of a Boucherot bridge modified with minimal inductance and in which the coil losses are artificially reproduced in order to increase the blocking attenuation.

In order to achieve a better suppression of the image frequencies $f_1$ and $f_2$ in lieu of limited coil qualities, the losses in the original capacitive component Csy are simulated both in the first and also in the second path, since the suppression does not depend on the quality of the parallel or series circuit, but instead on the harmonizing state of the bridge according to equation (5). A complete canceling of the image frequencies $f_1$ and $f_2$ may be achieved, even with lower coil qualities (i.e. air-core coils of a small design) at the cost of double transmission losses at the nominal frequency $f_0$. The circuits associated with the Boucherot bridges modified with minimal inductance are shown in FIGS. 10 and 11. The loss resistances of the coils are not explicitly shown in FIGS. 10 and 11 as resistance symbols.

In one embodiment depicted by FIG. 10, a loss resistance Rp is connected in parallel with the capacitive component Csy to "compensate" for the loss resistance of the inductance L1$a$ of the assigned path. The loss resistance of the coil L1$a$ is parallel with the coil in the equivalent circuit diagram. In another embodiment depicted by FIG. 11, the loss resistance Rs is inserted serially into the capacitive component Csy of the assigned path. A loss resistor (not shown) which acts serially with respect to the coil L2$a$ may, however, be compensated.

Corresponding circuits are also similarly possible for the two configurations with minimal capacitance. The series and/or parallel loss resistance Rs and/or Rp may alternatively be converted into a corresponding parallel and/or series loss resistor for a specific frequency.

Figure 12:
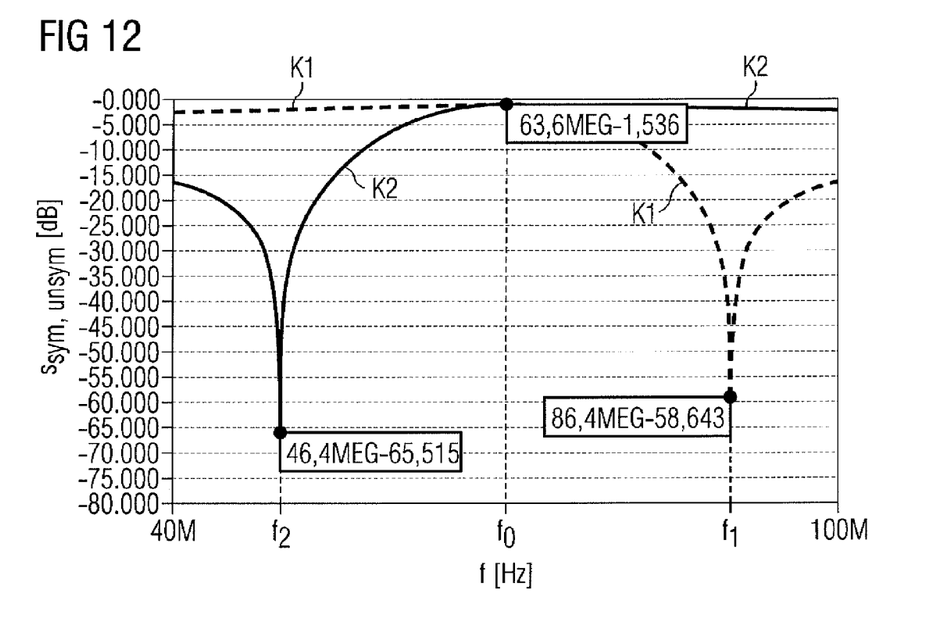
FIG. 12 shows the frequency response of the arrangements shown in FIGS. 10 and 11.

FIG. 12 shows the frequency responses K1 and K2 when the image frequencies $f_1$ and/or $f_2$ are suppressed using loss simulation according to the embodiments depicted in FIGS. 10 and 11. As is readily apparent, the transmission losses double with the nominal frequency $f_0$ to 1.5 db. An ideal blocking attenuation, which is greater than 60 dB, is therefore achieved within the scope of the numerical resolution.

It is also possible to attune the two LC parallel or series circuits to one another. This results in a reduction of the maximum blocking attenuation, as a result of which the blocked frequency band becomes wider.

Figure 13:
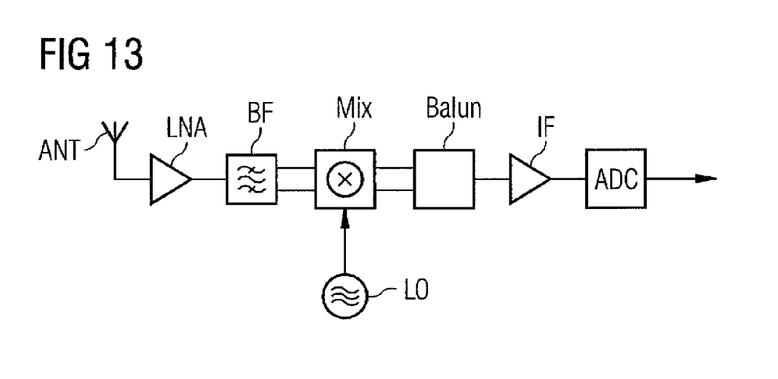
FIG. 13 shows a schematic representation of an antenna facility with an arrangement operable to perform a combined balancing and filtering of a non-symmetrical receiving signal.

FIG. 13 shows an antenna facility that includes a modified Boucherot bridge BF for the combined balancing and filtering of a non-symmetrical receiving signal. An antenna ANT supplies the non-symmetrical receiving signal to an amplifier LNA (Low Noise Amplifier). This non-symmetrical signal is fed to the modified Boucherot bridge BF, which is configured as described above. This balances and filters the receiving signal. The two outputs of the modified Boucherot bridge BF are connected to a mixer Mix that is activated further by a local oscillator LO. The symmetrical signal generated by the mixing is fed to a Balun unit Balun (balanced-unbalanced) for conversion into a signal unbalanced to ground. An amplifier IF (Intermediate Frequency Amplifier) supplies the amplified signal to an analog-digital converter ADC. In turn, the signal may be further digitally processed.

While the present invention has been described above by reference to various embodiments, it should be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:
1. An arrangement for processing a non-symmetrical signal, the arrangement comprising:
an apparatus operable to balance and filter an image frequency of a nominal frequency of the non-symmetrical signal, the apparatus comprising:
a modified Boucherot bridge having a series or parallel oscillating circuit instead of inductive or capacitive components found in a conventional Boucherot bridge, such that the modified Boucherot bridge is in a harmonized state for the image frequency to be faded out and has a predetermined impedance with a nominal frequency on symmetrical output terminals,
wherein the arrangement is operable to transmit the nominal frequency as a signal balanced to ground to the symmetrical output terminals of the modified Boucherot bridge.

2. The arrangement as claimed in claim 1, wherein:
the modified Boucherot bridge includes a first signal path and a second signal path,
the first signal path includes a series circuit that has an inductive component and a capacitive component between a terminal of a first port and a reference potential terminal,
a node point between the inductive component and the capacitive component in the first signal path forms a first terminal of a second port,
the second signal path between the terminal of the first port and the reference potential terminal includes a series circuit that has a capacitive component and an inductive component,
a node point between the capacitive component and the inductive component in the second signal path forms a second terminal of the second port,
the inductive components of the first signal path and the second signal path have a same inductance value,
the capacitive components of the first signal path and the second signal path have the same capacitance value,
each of the first signal path and the second signal path includes the series or parallel oscillating circuit that replaces the inductive or capacitive component found in the conventional Boucherot bridge, and
the series or parallel oscillating circuit in each of the first signal path and the second signal path has the same impedance as the inductive or capacitive component that is not replaced, such that the modified Boucherot bridge is in the harmonized state for the image frequency.

3. The arrangement as claimed in claim 2, wherein when a suppression of an image frequency that is greater than the nominal frequency is desired, the inductive components of the first signal path and the second signal path are replaced by a parallel circuit that has an inductance and a capacitance, or the capacitive components of the first signal path and the second signal path are replaced by a series circuit that has an inductance and a capacitance.

4. The arrangement as claimed in claim 3, wherein the inductances are coils without a core.

5. The arrangement as claimed in claim 3, further comprising a resistor connected in parallel with each of the capacitive components of the first signal path and the second signal path,
wherein the capacitive components of the first signal path and the second signal path are not replaced by a series or parallel oscillating circuit, and
wherein a value of the resistor corresponds to losses of the inductance in the respective signal path.

6. The arrangement as claimed in claim 3, further comprising a resistor connected in series with each of the capacitive components of the first signal path and the second signal path,
wherein the capacitive components of the first signal path and the second signal path are not replaced by a series or parallel oscillating circuit, and
wherein a value of the resistor corresponds to losses of the inductance in the respective signal path.

7. The arrangement as claimed in claim 2, wherein when a suppression of an image frequency that is smaller than the nominal frequency is desired, the inductive components of the first signal path and the second signal path are replaced by a series circuit that has an inductance and a capacitance, or the capacitive components of the first signal path and the second signal path are replaced by a parallel circuit having an inductance and a capacitance.

8. The arrangement as claimed in claim 7, wherein the inductances are coils without a core.

9. The arrangement as claimed in claim 7, further comprising a resistor connected in parallel with each of the capacitive components of the first signal path and the second signal path,
wherein the capacitive components of the first signal path and the second signal path are not replaced by a series or parallel oscillating circuit, and
wherein a value of the resistor corresponds to losses of the inductance in the respective signal path.

10. The arrangement as claimed in claim 7, further comprising a resistor connected in series with each of the capacitive components of the first signal path and the second signal path,
wherein the capacitive components of the first signal path and the second signal path are not replaced by a series or parallel oscillating circuit, and
wherein a value of the resistor corresponds to losses of the inductance in the respective signal path.

11. The arrangement as claimed in claim 1, wherein the arrangement is part of an antenna facility.

12. An arrangement for processing a signal balanced to ground, the arrangement comprising:
an apparatus operable to unbalance and filter an image frequency of a nominal frequency of the signal balanced to ground, the unbalancing representing a conversion of a signal balanced to ground into a signal not balanced to ground with a nominal frequency, the apparatus comprising:
a modified Boucherot bridge having a series or parallel oscillating circuit instead of inductive or capacitive components found in a conventional Boucherot bridge, such that the modified Boucherot bridge is in a harmonized state for the image frequency to be faded out and has a predetermined impedance with the nominal frequency on a non-symmetrical output terminal of the modified Boucherot bridge,
wherein the arrangement is operable to transmit the nominal frequency as a non-symmetrical signal to the non-symmetrical output terminal of the modified Boucherot bridge.

13. The arrangement as claimed in claim 12, wherein:
the modified Boucherot bridge includes a first signal path and a second signal path,
the first signal path includes a series circuit that has an inductive component and a capacitive component between a terminal of a first port and a reference potential terminal, a node point between the inductive component and the capacitive component in the first signal path forms a first terminal of a second port, the second signal path between the terminal of the first port and the reference potential terminal includes a series circuit that has a capacitive component and an inductive component, a node point between the inductive component and the capacitive component in the second signal path forms a second terminal of the second port, the inductive components of the first signal path and the second signal path have a same inductance value, the capacitive components of the first signal path and the second signal path have a same capacitance value, each of the first signal path and the second signal path includes the series or parallel oscillating circuit of the first signal path and the second signal path that replaces the inductive or capacitive component found in the conventional Boucherot bridge, and the series or parallel oscillating circuit in each of the first signal path and the second signal path has a same impedance as the inductive or capacitive component that is not replaced, such that the modified Boucherot bridge is in the harmonized state for the image frequency.

14. The arrangement as claimed in claim 12, wherein when a suppression of an image frequency that is greater than the nominal frequency is desired, the inductive components of the first signal path and the second signal path are replaced by a parallel circuit that has an inductance and a capacitance, or the capacitive components of the first signal path and the second signal path are replaced by a series circuit that has an inductance and a capacitance.

15. The arrangement as claimed in claim 14, wherein the inductances are coils without a core.

16. The arrangement as claimed in claim 14, further comprising a resistor connected in parallel with each of the capacitive components of the first signal path and the second signal path,
wherein the capacitive components of the first signal path and the second signal path are not replaced by a series or parallel oscillating circuit, and
wherein a value of the resistor corresponds to losses of the inductance in the respective signal path.

17. The arrangement as claimed in claim 14, further comprising a resistor connected in series with each of the capacitive components of the first signal path and the second signal path,
wherein the capacitive components of the first signal path and the second signal path are not replaced by a series or parallel oscillating circuit, and
wherein a value of the resistor corresponds to losses of the inductance in the respective signal path.

18. The arrangement as claimed in claim 12, wherein when a suppression of an image frequency that is smaller than the nominal frequency is desired, the inductive components of the first signal path and the second signal path are replaced by a series circuit that has an inductance and a capacitance, or the capacitive components of the first signal path and the second signal path are replaced by a parallel circuit that has an inductance and a capacitance.

19. The arrangement as claimed in claim 18, wherein the inductances are coils without a core.

20. The arrangement as claimed in claim 18, further comprising a resistor connected in parallel with each of the capacitive components of the first signal path and the second signal path,
wherein the capacitive components of the first signal path and the second signal path are not replaced by a series or parallel oscillating circuit, and
wherein a value of the resistor corresponds to losses of the inductance in the respective signal path.

21. The arrangement as claimed in claim 18, further comprising a resistor connected in series with each of the capacitive components of the first signal path and the second signal path,
wherein the capacitive components of the first signal path and the second signal path are not replaced by a series or parallel oscillating circuit, and
wherein a value of the resistor corresponds to losses of the inductance in the respective signal path.

22. The arrangement as claimed in claim 12, wherein the arrangement is part of an antenna facility.

* * * * *